United States Patent
Cross et al.

(10) Patent No.: US 11,092,893 B2
(45) Date of Patent: Aug. 17, 2021

(54) INSPECTION SENSITIVITY IMPROVEMENTS FOR OPTICAL AND ELECTRON BEAM INSPECTION

(71) Applicant: KLA CORPORATION, Milpitas, CA (US)

(72) Inventors: Andrew Cross, Hale (GB); Roel Gronheid, Leuven (BE)

(73) Assignee: KLA Corporation, Milpitas, CA (US)

( * ) Notice: Subject to any disclaimer, the term of this patent is extended or adjusted under 35 U.S.C. 154(b) by 29 days.

(21) Appl. No.: 16/518,948

(22) Filed: Jul. 22, 2019

(65) Prior Publication Data
US 2020/0183283 A1 Jun. 11, 2020

Related U.S. Application Data

(60) Provisional application No. 62/777,367, filed on Dec. 10, 2018.

(51) Int. Cl.
*G03F 7/26* (2006.01)
*G01N 21/00* (2006.01)
*G03F 7/20* (2006.01)

(52) U.S. Cl.
CPC ............ *G03F 7/265* (2013.01); *G01N 21/00* (2013.01); *G03F 7/7065* (2013.01); *G03F 7/70608* (2013.01)

(58) Field of Classification Search
CPC ..... G01N 21/00; G03F 7/265; G03F 7/70608; G03F 7/7065; G06T 7/0004
See application file for complete search history.

(56) References Cited

U.S. PATENT DOCUMENTS

| | | |
|---|---|---|
| 7,470,503 B1 | 12/2008 | Brandl |
| 7,521,172 B2 | 4/2009 | David et al. |
| 8,846,303 B2 | 9/2014 | Hatakeyama et al. |
| 2002/0071995 A1 | 6/2002 | Montgomery et al. |
| 2005/0008864 A1 | 1/2005 | Ingen Schenau et al. |
| 2007/0020534 A1 | 1/2007 | Yoshikawa et al. |
| 2008/0077362 A1 | 3/2008 | Willis et al. |
| 2012/0113416 A1 | 5/2012 | Lange et al. |
| 2016/0048075 A1 | 2/2016 | Takizawa et al. |
| 2017/0103924 A1 | 4/2017 | Park et al. |

FOREIGN PATENT DOCUMENTS

| | | |
|---|---|---|
| KR | 20050002384 A | 1/2005 |
| KR | 20170042432 A | 4/2017 |

OTHER PUBLICATIONS

Aruyama et al., "Novel EUV Resist Materials and Process for 20 nm Half Pitch and Beyond," Advances in Resist Materials and Processing Technology, Proc. of SPIE vol. 8682, 86820B, 2013.
WIPO, ISR for PCT/US2019/065309, dated Apr. 3, 2020.

*Primary Examiner* — Mark R Gaworecki
(74) *Attorney, Agent, or Firm* — Hodgson Russ LLP

(57) ABSTRACT

An inspection-sensitive additive can improve inspection of photoresist on semiconductor wafers. The inspection-sensitive additive can be used to stain the photoresist or can be deposited as a layer on the photoresist. The inspection-sensitive additive can have a k-value that is greater than 20% larger than a photoresist k-value of the photoresist layer for an inspection wavelength between 120 nm and 950 nm.

13 Claims, 3 Drawing Sheets

INSPECTION SENSITIVITY IMPROVEMENTS FOR OPTICAL AND ELECTRON BEAM INSPECTION

CROSS-REFERENCE TO RELATED APPLICATIONS

This application claims priority to the provisional patent application filed Dec. 10, 2018 and assigned U.S. App. No. 62/777,367, the disclosure of which is hereby incorporated by reference.

FIELD OF THE DISCLOSURE

This disclosure relates to optical and electron beam inspection.

BACKGROUND OF THE DISCLOSURE

Evolution of the semiconductor manufacturing industry is placing greater demands on yield management and, in particular, on metrology and inspection systems. Critical dimensions continue to shrink, yet the industry needs to decrease time for achieving high-yield, high-value production. Minimizing the total time from detecting a yield problem to fixing it determines the return-on-investment for a semiconductor manufacturer.

Lithography is a technique used in semiconductor manufacturing that involves coating a semiconductor wafer or a reticle substrate with a layer of photoresist. Lithography is used for making devices (e.g., semiconductor devices or micro machined devices) and for making masks used in photolithography for exposure of other wafers. The photoresist is sensitive to exposing energy which is typically ultraviolet light, a laser light, X-rays, or an electron beam. Portions of the photoresist are exposed and the remainder is not exposed. This is accomplished either by scanning a beam of the light or electrons across the photoresist to define patterns or, in the case of exposing certain types of wafers, applying the radiation through a partially transmissive mask, thereby exposing only non-masked portions of the photoresist. There are many formulations of photoresist for both electron beam exposure and light exposure at various wavelengths, as well as X-ray exposure.

The photoresist is subsequently developed. The unexposed regions of the photoresist are either removed or remain, with the complementary exposed portions either remaining or being removed depending on whether the photoresist works in negative tone or positive tone, respectively. Thus, the exposure patterns the photoresist on the substrate.

Subsequent steps typically involve ion implantation or etching or oxide growth so that the photoresist pattern is transferred into the underlying material. This is either the underlying substrate or, in the case of a mask, a thin layer of, for example, chromium metal applied between the photoresist and the substrate which is thereby partially removed to form a mask.

In a lithographic apparatus the size of features that can be imaged onto the substrate is limited by the wavelength of the projection radiation. To produce integrated circuits with a higher density of devices, and higher operating speeds, it is desirable to be able to image smaller features. While most current lithographic projection apparatus employ ultraviolet light generated by mercury lamps or excimer lasers, it has been proposed to use shorter wavelength radiation. Such radiation is termed extreme ultraviolet (EUV) or soft x-ray, and possible sources include, for example, laser-produced plasma sources, discharge plasma sources, or synchrotron radiation from electron storage rings.

When using EUV lithography, other requirements can be imposed on the process conditions, apparatus, and lithography methods when compared to ultraviolet (e.g., 365 nm) or deep ultra violet (e.g., 248 nm or 193 nm) lithography. Due to high absorption at EUV wavelengths a vacuum environment may be required.

Inspection of photoresist patterns (i.e., develop inspection) can be problematic. It can be difficult to determine a signal for defects at the lithography step during inspection. It also can be difficult to suppress previous layer noise, especially due to decoration of previous layer defects. These problems are becoming more challenging with advanced design rules and extreme ultraviolet lithography (EUVL). Scaling the photoresist pattern with smaller dimensions and thinner photoresist films further reduces the signal for defects of interest. Changing photoresist material characteristics was not possible because the wavelength used for exposure in the lithography scanner system was similar to that used for optical inspection.

Stack engineering was previously performed. The material or material stack under the photoresist was optimized to try to maximize signal while reducing noise. This provides limited sensitivity improvements for certain photoresist types, defect types, and thicknesses. This technique also can be limited to monitoring certain applications because stack engineering requires changes to thicknesses and potentially materials in the underlying stack. The ultimate sensitivity that can be achieved is still primarily influenced by n-value, k-value, and thickness of the photoresist itself. Thus, stack engineering can only provide limited sensitivity improvements.

In another previous technique, a pattern was transferred into a layer with high signal for inspection (e.g., after etch inspection). However, this increases time-to-results and induces new defect issues and mechanisms for the etch process that can be difficult to de-convolve from the lithography defect issues of interest.

Therefore, improvements to signal-to-noise for challenging inspection applications are needed.

BRIEF SUMMARY OF THE DISCLOSURE

A device is provided in a first embodiment. The device comprises a semiconductor wafer, a photoresist layer disposed on the semiconductor wafer, and a layer disposed on a top surface of the photoresist layer. The photoresist layer defines at least one top surface and at least one sidewall. The layer includes an inspection-sensitive additive. The inspection-sensitive additive has a k-value that is greater than 20% larger than a photoresist k-value of the photoresist layer for an inspection wavelength between 120 nm and 950 nm.

The layer may not be disposed on the sidewall.

The layer can have a thickness of less than 5 nm.

In an instance, the k-value is greater than 50% larger than the photoresist k-value of the photoresist layer.

The inspection-sensitive additive may be a metal such as titanium, cobalt, or ruthenium. The inspection-sensitive additive also may be zirconium oxide or hafnium oxide. The inspection sensitive additive also may be a silicon-based film or a graphite-based film.

In an instance, the inspection wavelength is 193 nm.

A device is provided in a second embodiment. The device comprises a semiconductor wafer and a photoresist layer disposed on the semiconductor wafer. The photoresist layer includes an inspection-sensitive additive. The inspection-sensitive additive has a k-value that is greater than 20% larger than a photoresist k-value of the photoresist layer for an inspection wavelength between 120 nm and 950 nm.

The inspection-sensitive additive may be one of silicon oxide, silicon nitride, or silicon oxynitride. The inspection-sensitive additive also may be aluminum oxide.

In an instance, the k-value is greater than 50% larger than the photoresist k-value of the photoresist layer.

In an instance, the inspection wavelength is 193 nm.

A method is provided in a third embodiment. The method comprises providing a device. The device includes a semiconductor wafer and a photoresist layer. The photoresist layer includes an inspection-sensitive additive. The inspection-sensitive additive has a k-value that is greater than 20% larger than a photoresist k-value of the photoresist layer for an inspection wavelength between 120 nm and 950 nm. The device having the photoresist layer is inspected with an optical inspection system using an inspection wavelength between 120 nm and 950 nm or an electron beam inspection system.

In an instance, the inspecting uses the optical inspection system and the inspection wavelength is 193 nm.

In an instance, the k-value is greater than 50% larger than the photoresist k-value of the photoresist layer.

The method can further include staining the photoresist layer prior to the inspecting. The staining may be a gas-phase staining technique or a liquid-phase staining technique. The inspection-sensitive additive can be in the photoresist layer. The inspection-sensitive additive can be one of silicon oxide, silicon nitride, silicon oxynitride, or aluminum oxide.

The method can further include depositing an inspection-sensitive layer on the top surface of the photoresist layer, such as by atomic layer deposition. The inspection-sensitive additive is in the inspection-sensitive layer. The inspection sensitive additive can be one of titanium, cobalt, ruthenium, hafnium oxide, zirconium oxide, or can include a silicon-based film or a graphite-based film. The inspection-sensitive layer can have a thickness of less than 5 nm.

DESCRIPTION OF THE DRAWINGS

For a fuller understanding of the nature and objects of the disclosure, reference should be made to the following detailed description taken in conjunction with the accompanying drawings, in which.

DETAILED DESCRIPTION OF THE DISCLOSURE

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

Embodiments disclosed herein enable improvements in signal-to-noise for challenging inspection applications, such as after develop inspection (ADI), to improve sensitivity and reduce noise for both existing and new photoresist materials. This includes photoresist materials that form thinner photoresist layers. A film with optical characteristics that enables an improved signal on top of the photoresist can be deposited using atomic layer deposition (ALD) to allow the deposition of ultra-thin conformal or selective deposition of materials. The optical characteristics of the photoresist also can be changed to provide improved sensitivity parameters. This can provide improved time-to-results compared to previous techniques.

Figure 1:
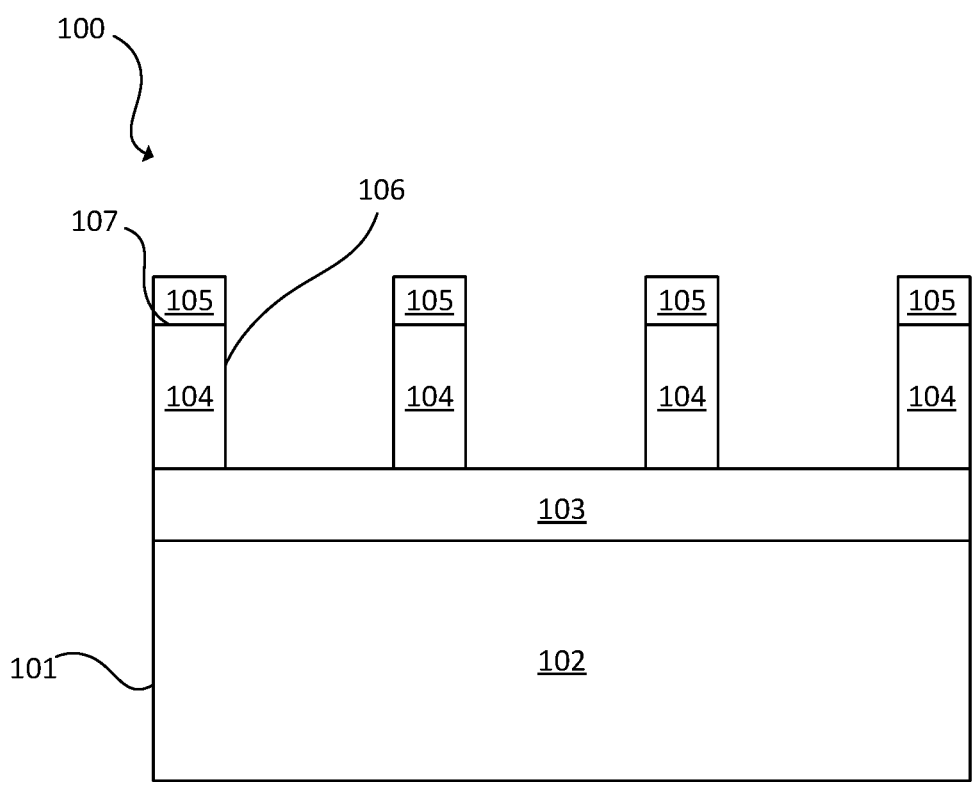
FIG. 1 is a cross-sectional view of a first embodiment of a device in accordance with the present disclosure.

FIG. 1 is a cross-sectional view of a first embodiment of a device 100. The device includes a semiconductor wafer 101, which has a spin on carbon (SoC) layer 102 and a spin on glass (SoG) layer 103. Other wafer layers or materials are possible. The SoC layer 102 may have a thickness of approximately 65 nm. The SoG layer 103 may have a thickness of approximately 10 nm. Other thicknesses are possible.

A photoresist layer 104 is disposed on the semiconductor wafer 101. The photoresist layer 104 defines at least one top surface 107 and at least one sidewall 106. Two sidewalls 106 are illustrated on each pillar of the photoresist layer 104 in FIG. 1. The photoresist layer 104 may have a thickness of approximately 35 nm. Other thicknesses are possible. The photoresist layer 104 may have various chemistries and can be positive or negative photoresist.

In an embodiment, the photoresist layer 104 has a plurality of lines, spaces, contacts, pillars, or other two-dimensional shapes. For example 193i critical dimensions can be on the order of 40 nm and for EUV patterns these may be as small as 16 nm lines. Other configurations of the photoresist layer 104 are possible.

A layer 105 is disposed on the top surface 107 of the photoresist layer 104. The presence of the layer 105 on the sidewall 106 can be minimized. The layer 105 includes an inspection-sensitive additive. In an example, the layer 105 is made of the inspection-sensitive additive.

The inspection-sensitive additive for the layer 105 may be a metal in an example, such as titanium, cobalt, or ruthenium. In another example, the inspection-sensitive additive for the layer 105 may be zirconium oxide or hafnium oxide. In yet another example, the inspection-sensitive additive for the layer 105 may be a silicon-based film or a graphite-based film. Purity of the layer 105 can be maintained to reduce defects.

In an instance, more than one metal or other inspection-sensitive additive can be combined into the layer 105. In yet another instance, a plurality of different layers 105 can be disposed on the top surface 107.

The layer 105 can be deposited using atomic layer deposition (ALD), which can provide the desired shape and thickness for the layer 105. Chemical vapor deposition (CVD) or other deposition techniques also can be used. The layer 105 may not affect the degree that the photoresist 104 is conformal.

The layer 105 can have a thickness of less than 5 nm. For example, the layer 105 can have a thickness from 0.5 nm to 5 nm, including all values to the 0.5 nm and ranges between.

The inspection-sensitive additive in the layer 105 has a k-value that is greater than 20% larger than a photoresist k-value of the photoresist layer 104 for an inspection wavelength between 120 nm and 950 nm. In an instance, the k-value of the inspection-sensitive additive in the layer 105 is greater than 50% larger than the photoresist k-value of the photoresist layer (i.e., without the layer 105). For example, the k-value of the inspection-sensitive additive in the layer 105 can be greater than 55%, 60%, 65%, 70%, 75%, 80%, 85%, or 90% larger than the photoresist k-value of the photoresist layer. The k-values are taken at the same wavelength and process conditions. The k-value for a 193 nm photoresist may be approximately 0.05 at 193 nm, but other k-values are possible and this is merely one example. For example, the k-value of the photoresist may be from 0.01 and 0.4, from 0.01 and 0.5, or from 0.01 and 0.6, but higher values are possible.

In an instance, the inspection wavelength is 193 nm or 190 nm, though other wavelengths are possible.

With a layer 105 providing higher signal on the surface of the photoresist 104, the improvements to sensitivity may be several fold, such as 2× to greater than 10× in signal. The layer 105 can be configured to be thin enough to not affect pattern fidelity of the photoresist 104 and to be selectively deposited mostly or only on the top surface 107 of the photoresist 104.

The deposition process for the layer 105 can occur at a low enough temperature to avoid or minimize damage the pattern of the photoresist 104. Various ALD processes can operate at low enough temperatures to avoid photoresist damage.

Figure 2:
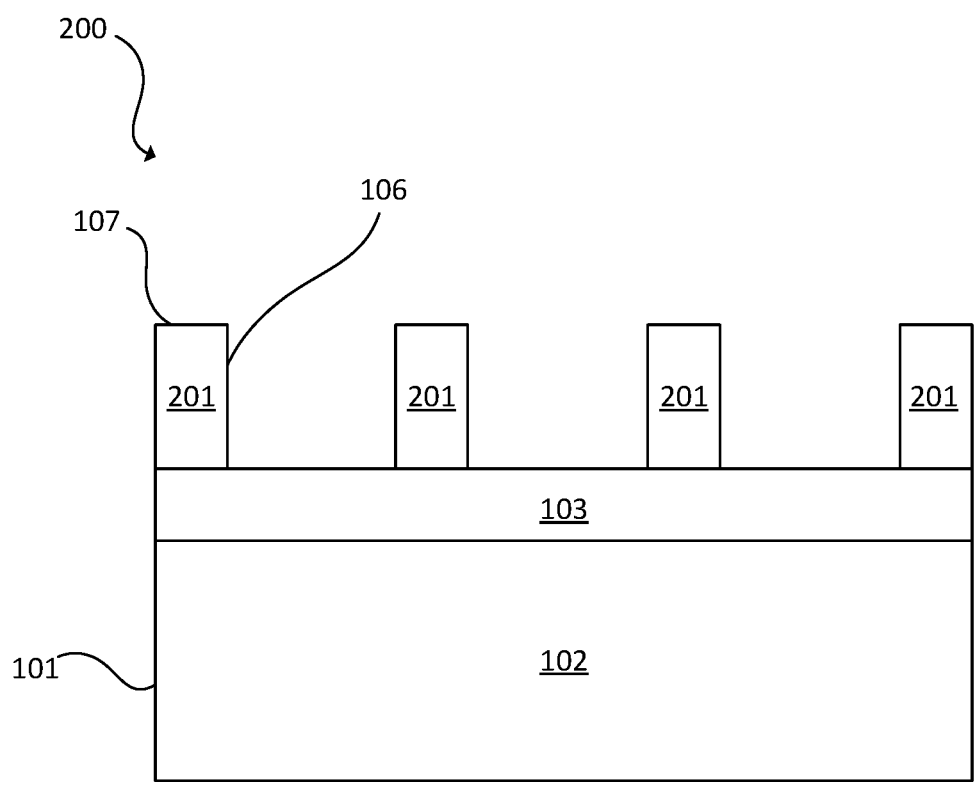
FIG. 2 is a cross-sectional view of a second embodiment of a device in accordance with the present disclosure.

With the transition to EUV lithography and the reduction in exposure wavelength (e.g., to 13.5 nm) dye or materials can be introduced to the photoresist layer to change the n-value and k-value of a material at wavelengths used for inspection. FIG. 2 is a cross-sectional view of a second embodiment of a device 200. The photoresist layer 201 is disposed on the semiconductor wafer 101. The photoresist layer 201 may have a thickness of approximately 35 nm. Other thicknesses are possible. The photoresist layer 201 may have various chemistries and can include positive or negative photoresist.

The photoresist layer 201 includes an inspection-sensitive additive in the photoresist layer 201. The inspection-sensitive additive has a k-value that is greater than 20% larger than a photoresist k-value of the photoresist layer 201 (i.e., without the inspection-sensitive additive) for an inspection wavelength between 120 nm and 950 nm. In an instance, the k-value can be greater than 50% larger than the photoresist k-value of the photoresist layer 201. For example, the k-value that can be greater than 55%, 60%, 65%, 70%, 75%, 80%, 85%, or 90% larger than the photoresist k-value of the photoresist layer 201 (i.e., without the inspection-sensitive additive). The k-values are taken at the same wavelength and process conditions. The k-value for a 193 nm photoresist without the inspection-sensitive additive may be approximately 0.05 at 193 nm, but other k-values are possible and this is merely one example. For example, the k-value of the photoresist may be from 0.01 and 0.4, from 0.01 and 0.5, or from 0.01 and 0.6, but higher values are possible.

In an instance, the inspection wavelength is 190 nm or 193 nm, though other wavelengths are possible.

In an example, the inspection-sensitive additive for the photoresist layer 201 is one of silicon oxide, silicon nitride, or silicon oxynitride. In another example, the inspection-sensitive additive for the photoresist layer 201 is aluminum oxide. More than one of these materials can be used as an inspection-sensitive additive. Purity of the inspection-sensitive additive can be maintained to reduce defects.

Altering the composition of the photoresist in the photoresist layer 201 with the inspection-sensitive additive can provide improved signal in the wavelength range of inspection. The inspection-sensitive additive can be used with EUV photoresists. The change to the photoresist can be homogenous across a dimension of the photoresist layer 201.

An infiltration technique can be used to add the inspection-sensitive additive to the photoresist layer 201. This includes an infiltration technique such as sequential infiltration synthesis (SIS) or a solvent-based staining technique. Thus, gas-phase or liquid-phase techniques can be applied after the photoresist layer 201 is patterned. This can change optical parameters of the polymeric photoresist materials after the patterning step.

SIS is a self-limiting cyclic process in which a gas-phase precursor (e.g., a metal-based reducing agent) diffuses into a porous organic material (e.g., a photoresist) and reacts with its functional groups. Next, an oxidative agent diffuses, reacts with pending groups of the reducing agent, and restores new oxidative sites. This process may be repeated until the desired loading concentration is achieved. The sequence is similar to ALD, but the cycles are longer and at higher pressure to promote diffusion into the material, rather than just surface chemistry. The number of cycles (e.g., <10) may be less than ALD.

In solvent-based staining techniques, the desired staining agent is dissolved and diffuses into and attaches to the photoresist by chemi- or physisorption.

An inorganic underlayer (e.g., $SiO_x$, AlO, SiN, or SiOC) may be used. The inorganic underlayer can be disposed between the photoresist layer 201 and the semiconductor wafer 101. The semiconductor wafer 101 can be a bare wafer or can include a film stack under the inorganic underlayer. Polymeric underlayers may be affected by the staining process, which could result in no improved contrast. Therefore, inorganic materials may be used for the underlayer.

Figure 3:
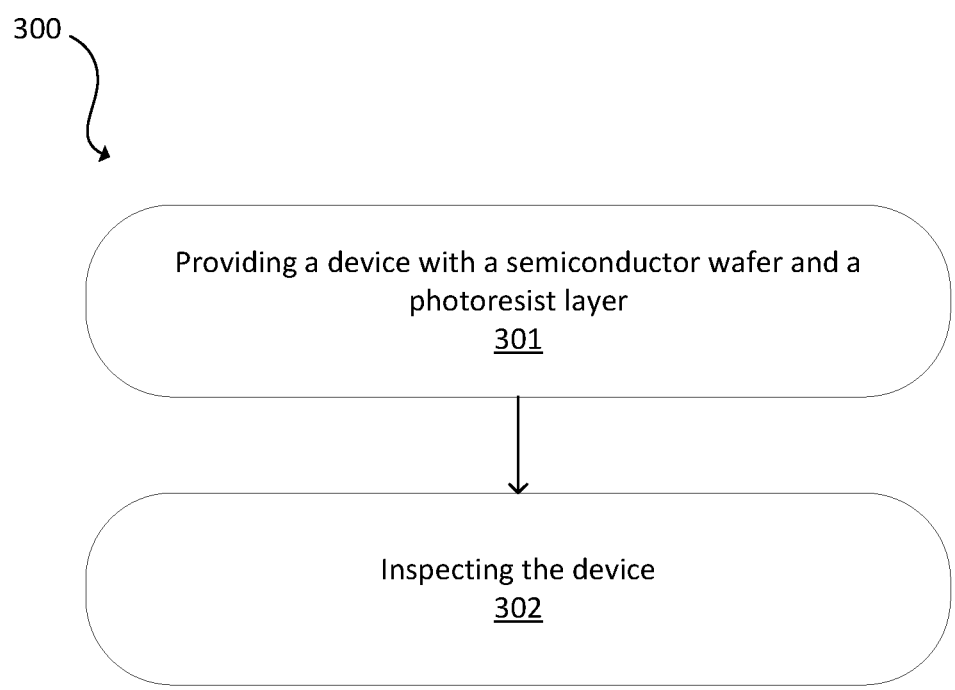
FIG. 3 is a flowchart of a method embodiment in accordance with the present disclosure.

FIG. 3 is a flowchart of a method 300. At 301, a device is provided. The device includes a semiconductor wafer and a photoresist layer. The photoresist layer includes an inspection-sensitive additive. The inspection-sensitive additive has a k-value that is greater than 20% larger than a photoresist k-value of the photoresist layer for an inspection wavelength between 120 nm and 950 nm (i.e., within the inspection-sensitive additive). For example, the k-value can be greater than 50% larger than the photoresist k-value of the photoresist layer. The k-values are taken at the same wavelength and process conditions.

At 302, the device having the photoresist layer is inspected with an optical inspection system using an inspection wavelength between 120 nm and 950 nm or an electron beam inspection system. In an instance, the inspection wavelength is 193 nm. Having a material contrast to the pattern of interest and underlying films can assist during defect detection. Defects are often captured due to these material differences.

In an embodiment, the photoresist layer is stained prior to the inspecting. The staining can be a gas-phase staining technique or a liquid-phase staining technique. The inspection-sensitive additive is in the photoresist in this embodiment. For this embodiment, the inspection-sensitive additive can be one of silicon oxide, silicon nitride, silicon oxynitride, or aluminum oxide.

In another embodiment, an inspection-sensitive layer is deposited on the top surface of the photoresist layer. The depositing can be ALD. The inspection-sensitive additive is in the inspection-sensitive layer. For this embodiment, the inspection sensitive additive can be one of titanium, cobalt, ruthenium, a hafnium oxide, zirconium oxide, or can include a silicon-based film or a graphite-based film. Such an inspection-sensitive layer has a thickness of less than 5 nm.

Embodiments of this method can enable improvements of signal to defects of interest (DOI) in a patterned photoresist layer and enable improvements in capture rate for defects of interest during inspection of semiconductor wafers. This signal improvement can enable faster cycles of learning on lithography-related defect issues. This also can allow greater adoption of after-develop inspection in high volume manufacturing (HVM), which can reduce the time-to-results for the identification of defect excursions related to lithography patterning. The improved signal also can increase confidence in defect and signal capture for the effective reduction of such issues because of lower signal-to-noise. Besides improving signal to lithography-related defects of interest, embodiments of this method can also suppress noise. Photoresists generally enhance defects in previous layers that increase noise for the current layer. This impact can be reduced with an optically opaque film. The effect of previous layer film thickness variations also should be reduced, but these are a more global effect and improvements may be smaller. In particular, noise can be suppressed for the decoration of previous layer defects by the photoresist pattern.

The photoresist layer also can be deposited on an oxide. An optimized thickness of oxide can be beneficial in increasing sensitivity.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:

1. A device comprising:
    a semiconductor wafer;
    a photoresist layer disposed on the semiconductor wafer, wherein the photoresist layer defines at least one top surface and at least one sidewall; and
    a layer only disposed on the top surface of the photoresist layer such that at least some of the sidewall of the photoresist layer is exposed, wherein the layer includes an inspection-sensitive additive, and wherein the inspection-sensitive additive has a k-value that is greater than 20% larger than a photoresist k-value of the photoresist layer for an inspection wavelength between 120 nm and 950 nm.

2. The device of claim 1, wherein the layer has a thickness of less than 5 nm.

3. The device of claim 1, wherein the k-value is greater than 50% larger than the photoresist k-value of the photoresist layer.

4. The device of claim 1, wherein the inspection-sensitive additive is a metal.

5. The device of claim 4, wherein the metal is titanium, cobalt, or ruthenium.

6. The device of claim 1, wherein the inspection-sensitive additive is zirconium oxide or hafnium oxide.

7. The device of claim 1, wherein the inspection sensitive additive is a silicon-based film or a graphite-based film.

8. The device of claim 1, wherein the inspection wavelength is 193 nm.

9. A method comprising:
    providing a device, wherein the device includes a semiconductor wafer and a photoresist layer;
    staining the photoresist layer such that the photoresist layer includes an inspection-sensitive additive after the staining, wherein the staining is a gas-phase staining technique or a liquid-phase staining technique, wherein the inspection-sensitive additive is in the photoresist layer, and wherein the inspection-sensitive additive has a k-value that is greater than 20% larger than a photoresist k-value of the photoresist layer for an inspection wavelength between 120 nm and 950 nm; and
    inspecting the device having the photoresist layer with an optical inspection system after the staining using an inspection wavelength between 120 nm and 950 nm or an electron beam inspection system.

10. The method of claim 9, wherein the inspecting uses the optical inspection system and wherein the inspection wavelength is 193 nm.

11. The method of claim 9, wherein the k-value is greater than 50% larger than the photoresist k-value of the photoresist layer.

12. The method of claim 9, wherein the inspection-sensitive additive is one of silicon oxide, silicon nitride, silicon oxynitride, or aluminum oxide.

13. The method of claim 12, wherein the inspection-sensitive additive is aluminum oxide.

* * * * *